United States Patent
Hashimoto et al.

(10) Patent No.: US 10,389,339 B2
(45) Date of Patent: Aug. 20, 2019

(54) DEVICE AND METHOD FOR CONTROLLING SLEW RATE

(71) Applicant: ROHM CO., LTD., Ukyo-Ku, Kyoto (JP)

(72) Inventors: Tetsuro Hashimoto, Kyoto (JP); Tsutomu Ishino, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 39 days.

(21) Appl. No.: 15/486,647

(22) Filed: Apr. 13, 2017

(65) Prior Publication Data

US 2017/0317667 A1 Nov. 2, 2017

(30) Foreign Application Priority Data

Apr. 28, 2016 (JP) ................................ 2016-090737

(51) Int. Cl.
*H03K 5/12* (2006.01)
*H03K 5/05* (2006.01)
*G05F 1/575* (2006.01)

(52) U.S. Cl.
CPC ............... *H03K 5/05* (2013.01); *G05F 1/575* (2013.01); *H03K 5/12* (2013.01)

(58) Field of Classification Search
CPC ............. H03K 5/05; H03K 5/12; G05F 1/575
See application file for complete search history.

(56) References Cited

U.S. PATENT DOCUMENTS 8,138,794 B2 * 3/2012 Mei .......................... G11C 7/04
326/30

FOREIGN PATENT DOCUMENTS

JP 2010193246 A 9/2010

* cited by examiner

*Primary Examiner* — Jung Kim
(74) *Attorney, Agent, or Firm* — Cantor Colburn LLP

(57) ABSTRACT

A slew rate control device for controlling a slew rate, includes: a setting part configured to set a voltage value used to determine the slew rate; and a control part configured to control the slew rate, based on the voltage value set by the setting part, so that the slew rate becomes slower as an output voltage of a power supply approaches from a transition starting voltage to a target voltage.

20 Claims, 17 Drawing Sheets

FIG. 11

| Vout [V] | Slope [ mV/usec] | Ichg [A] | Vin [V] | Iin [A] |
|---|---|---|---|---|
| 0 | - | - | - | - |
| 0.05 | 40 | 5.28 | 5 | 0.0528 |
| 0.1 | 40 | 5.28 | 5 | 0.1056 |
| 0.15 | 40 | 5.28 | 5 | 0.1584 |
| 0.2 | 40 | 5.28 | 5 | 0.2112 |
| 0.25 | 40 | 5.28 | 5 | 0.264 |
| 0.3 | 40 | 5.28 | 5 | 0.3168 |
| 0.35 | 40 | 5.28 | 5 | 0.3696 |
| 0.4 | 40 | 5.28 | 5 | 0.4224 |
| 0.45 | 40 | 5.28 | 5 | 0.4752 |
| 0.5 | 40 | 5.28 | 5 | 0.528 |
| 0.55 | 40 | 5.28 | 5 | 0.5808 |
| 0.6 | 40 | 5.28 | 5 | 0.6336 |
| 0.65 | 40 | 5.28 | 5 | 0.6864 |
| 0.7 | 40 | 5.28 | 5 | 0.7392 |
| 0.75 | 40 | 5.28 | 5 | 0.792 |
| 0.8 | 40 | 5.28 | 5 | 0.8448 |
| 0.85 | 40 | 5.28 | 5 | 0.8976 |
| 0.9 | 40 | 5.28 | 5 | 0.9504 |
| 0.95 | 40 | 5.28 | 5 | 1.0032 |
| 1 | 40 | 5.28 | 5 | 1.056 |

FIG. 12

| Vout [V] | Slope [mV/usec] | Ichg [A] | Vin [V] | Iin [A] |
|---|---|---|---|---|
| 0 | - | - | - | - |
| 0.05 | 50 | 6.6 | 5 | 0.066 |
| 0.1 | 50 | 6.6 | 5 | 0.132 |
| 0.15 | 50 | 6.6 | 5 | 0.198 |
| 0.2 | 50 | 6.6 | 5 | 0.264 |
| 0.25 | 50 | 6.6 | 5 | 0.33 |
| 0.3 | 40 | 5.28 | 5 | 0.3168 |
| 0.35 | 40 | 5.28 | 5 | 0.3696 |
| 0.4 | 40 | 5.28 | 5 | 0.4224 |
| 0.45 | 40 | 5.28 | 5 | 0.4752 |
| 0.5 | 40 | 5.28 | 5 | 0.528 |
| 0.55 | 40 | 5.28 | 5 | 0.5808 |
| 0.6 | 40 | 5.28 | 5 | 0.6336 |
| 0.65 | 40 | 5.28 | 5 | 0.6864 |
| 0.7 | 40 | 5.28 | 5 | 0.7392 |
| 0.75 | 40 | 5.28 | 5 | 0.792 |
| 0.8 | 30 | 3.96 | 5 | 0.6336 |
| 0.85 | 30 | 3.96 | 5 | 0.6732 |
| 0.9 | 30 | 3.96 | 5 | 0.7128 |
| 0.95 | 30 | 3.96 | 5 | 0.7524 |
| 1 | 30 | 3.96 | 5 | 0.792 |

# DEVICE AND METHOD FOR CONTROLLING SLEW RATE

CROSS-REFERENCE TO RELATED APPLICATIONS

This application is based upon and claims the benefit of priority from Japanese Patent Application No. 2016-090737, filed on Apr. 28, 2016, the entire contents of which are incorporated herein by reference.

TECHNICAL FIELD

The present disclosure relates to a device and method for controlling a slew rate.

BACKGROUND

DVS (Dynamic Voltage Scaling) is known as a technique for realizing low power consumption of a semiconductor integrated circuit. The DVS is a technique for dynamically changing a voltage of a circuit block such as a processor according to a processing capability of the circuit block.

Currently, a general method of increasing an output voltage at the same slew rate at regular intervals is being used to digitally control an output slew rate of a DC/DC converter by DVS.

However, when starting up and shutting down the DC/DC converter to a high speed (for example, 40 mV/μsec or more), a rush current or an overshoot increases. Although a technique for controlling the slew rate is proposed in the related art, this technique cannot sufficiently reduce the rush current and the overshoot.

SUMMARY

The present disclosure provides some embodiments of a slew rate control device and a slew rate control method capable of reducing a rush current and an overshoot.

According to one embodiment of the present disclosure, there is provided a slew rate control device for controlling a slew rate. The slew rate control device includes: a setting part configured to set a voltage value used to determine the slew rate; and a control part configured to control the slew rate, based on the voltage value set by the setting part, so that the slew rate becomes slower as an output voltage of a power supply approaches from a transition starting voltage to a target voltage.

According to another embodiment of the present disclosure, there is provided a method for controlling a slew rate, including: setting a voltage value used to determine the slew rate; and controlling the slew rate, based on the set voltage value, so that the slew rate becomes slower as an output voltage approaches from a transition starting voltage to a target voltage.

BRIEF DESCRIPTION OF THE DRAWINGS

FIG. 11 is a view showing a relationship between an output voltage, a slope of the voltage, a charging current, an input voltage and an input current in a case of using the slew rate control device according to the comparative example;

FIG. 12 is a view showing a relationship between an output voltage, a slope of the voltage, a charging current, an input voltage and an input current in a case of using the slew rate control device according to the embodiment;

DETAILED DESCRIPTION

Figure 1:
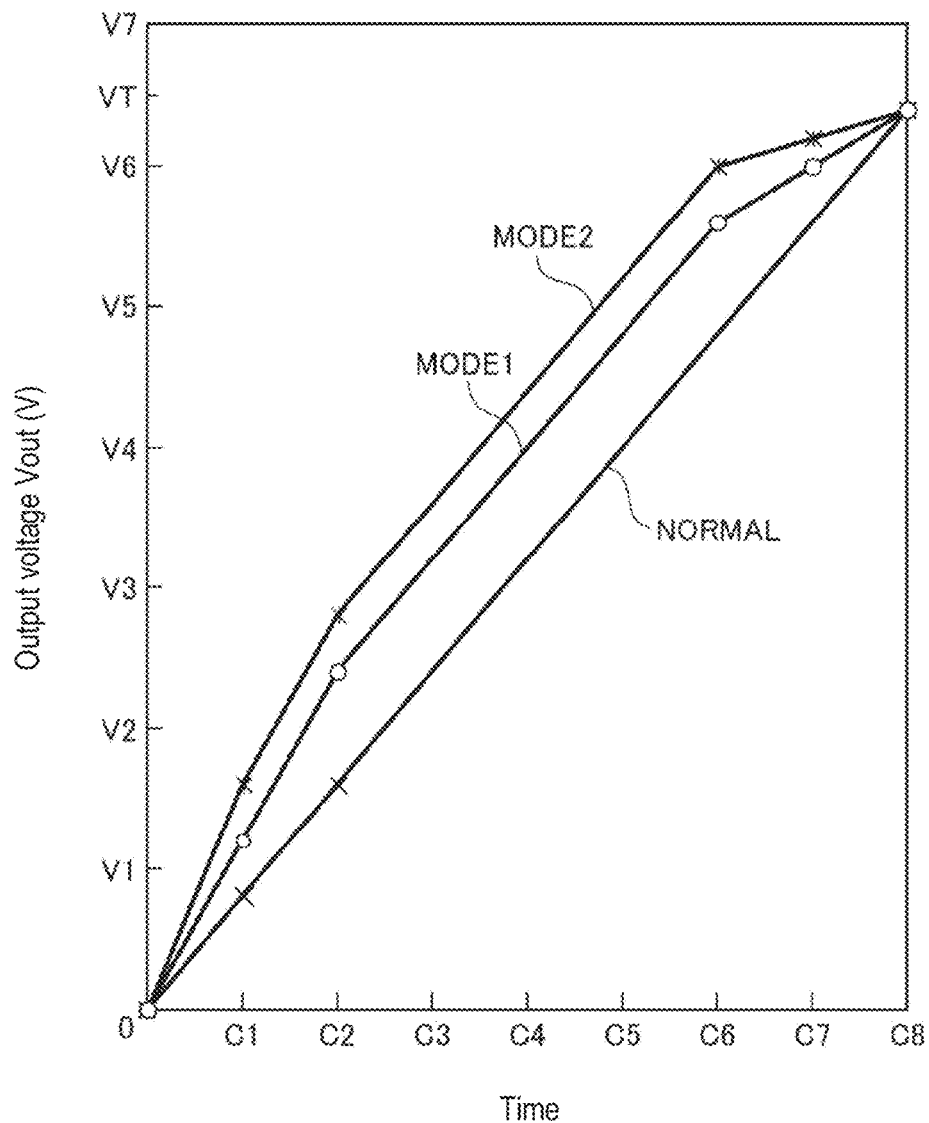
FIG. 1 is a graph showing a slew rate controlled by a slew rate control device according to an embodiment.

Embodiments of the present disclosure will now be described in detail with reference to the drawings. Throughout the drawings, the same or similar elements are denoted by the same or similar reference numerals. It is however noted that the drawings are just schematic and relationships between thickness and planar dimension of elements, thickness ratios of various layers and so on may be unrealistic. Accordingly, detailed thickness and dimensions should be determined in consideration of the following description. In addition, it is to be understood that the figures include different dimensional relationships and ratios.

The following embodiments are provided to illustrate devices and methods to embody the technical ideas of the present disclosure and are not limited to materials, forms, structures, arrangements and so on of elements detailed herein. The embodiments of the present disclosure may be modified in different ways without departing from the spirit and scope of the invention defined in the claims.

[Embodiments]

(Overview)

FIG. 1 is a graph showing a slew rate controlled by a slew rate control device according to an embodiment. In this figure, the vertical axis represents a final output voltage of a power supply such as a DC/DC converter and the horizontal axis represents time (counter value).

For example, a general method of increasing an output voltage at the same slew rate at regular intervals, such as a waveform "NORMAL" shown in FIG. 1, is being used to digitally control an output slew rate of the DC/DC converter by DVS. However, when starting up and shutting down the DC/DC converter to a high speed for example, 40 mV/μsec or more), there is a problem that a rush current and an overshoot increase.

Therefore, this embodiment adopts a method of controlling a slew rate so that the slew rate becomes slower as an output voltage of the power supply approaches from a transition starting voltage to a target voltage, such as waveforms "MODE1" and "MODE2" shown in FIG. 1. In other words, a control part controls the slew rate so that the slew rate becomes faster in a first rising region and becomes slower in a region where the output voltage is close to the target voltage (a final point of arrival) so as to draw an arc. This makes it possible to reduce a rush current and an overshoot, as will be described later.

Since a stress applied to an external capacitor can be reduced by the reduction of the rush current, the lifetime can be extended and the reliability can be improved. In addition, even when an output power exceeds an input power, the output power can be reduced so as to prevent the system from becoming unstable. In addition, even when the remaining capacity of a rechargeable battery of a battery-driven device while being charged is slight and a voltage is lowered, the maximum rush current is reduced to make it possible to use an inexpensive and compact adapter whose supply power output is smaller, thereby making it possible to continue the operation of the system without shutting down the system. Further, by reducing an overshoot, it is possible to prevent a load circuit from being destructed due to a voltage exceeding a withstand voltage.

(Slew Rate Control Device)

Figure 2:
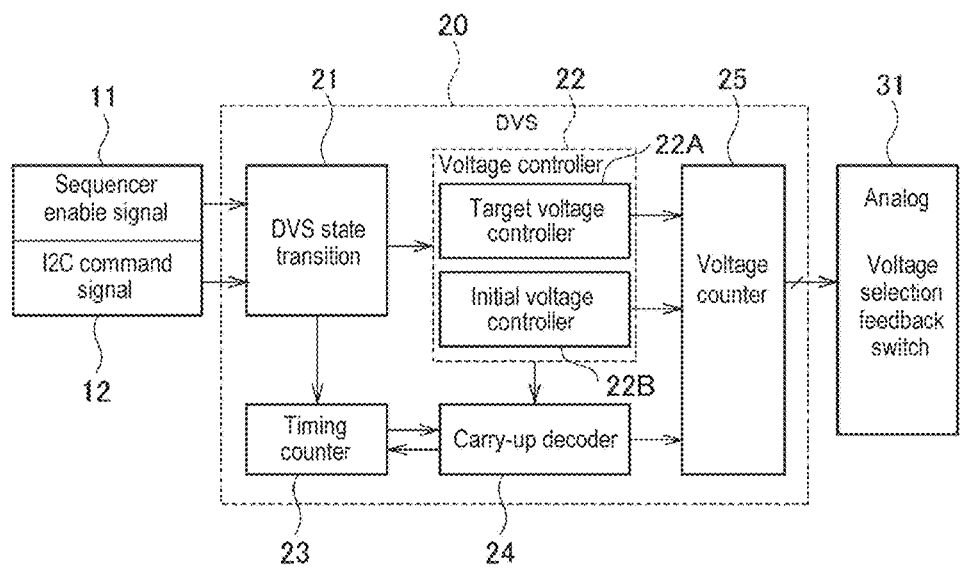
FIG. 2 is a schematic block diagram of the slew rate control device according to the embodiment.

FIG. 2 is a schematic block diagram of a slew rate control device 20 according to the embodiment. The slew rate control device 20 is provided to control a slew rate and includes a setting part which sets a voltage value used to determine the slew rate, and a control part which controls the slew rate, based on the voltage value set by the setting part, so that the slew rate becomes slower as an output voltage approaches from a transition starting voltage to a target voltage. Specifically, the slew rate control device 20 is a device for digitally controlling an output slew rate of a power supply such as a DC/DC converter by DVS, and includes a DVS state transition 21, a voltage controller 22, a timing counter 23, a carry-up decoder 24 and a voltage counter 25, as shown in FIG. 2.

The DVS state transition 21 manages DVS voltage transition. For example, when a trigger by a sequencer enable signal 11, an I2C command signal 12, an external enable terminal or the like is input, the DVS voltage transition (rising transition or falling transition) is started.

The voltage controller 22 includes a target voltage controller 22A and an initial voltage controller 22B. The target voltage controller 22A has a function of setting an arbitrary target voltage. The initial voltage controller 22B has a function of setting the present voltage (an arbitrary transition starting voltage).

The timing counter 23 is a counter used to determine a slew rate.

The carry-up decoder 24 divides a difference between the target voltage and the present voltage into at least three regions and adjusts a timing at which a voltage is changed.

The voltage counter 25 changes a voltage at a timing adjusted by the carry-up decoder 24 and outputs a decode value to an analog processing part 31.

The analog processing part 31 is an analog circuit including a voltage selection feedback switch and the like. Details of the analog processing unit 31 will be described later.

(First Modification of Slew Rate Control Device)

Figure 3:
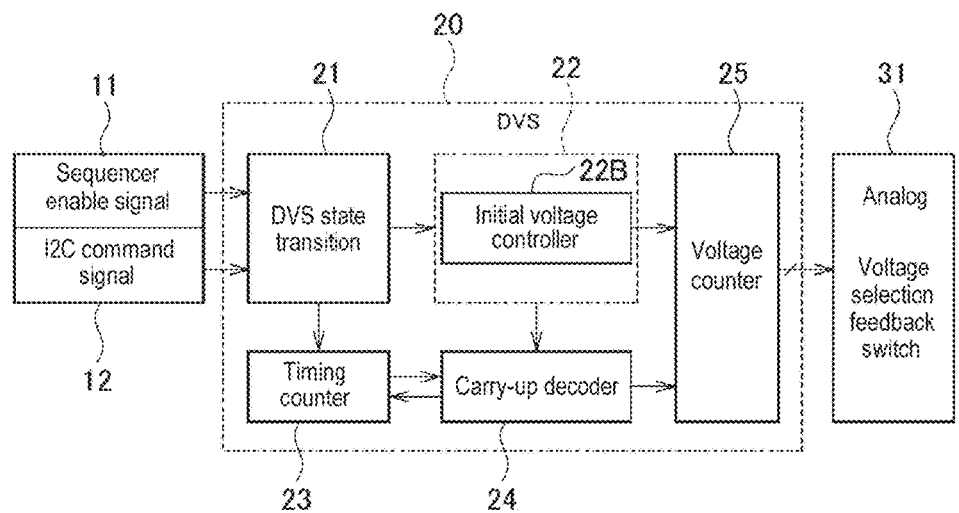
FIG. 3 is a schematic block diagram of a first modification of the slew rate control device shown in FIG. 2.

FIG. 3 shows a first modification of the slew rate control device 20 shown in FIG. 2. As shown in FIG. 3, the voltage controller 22 may not include the target voltage controller 22A. That is, when a fixed target voltage (for example, 1V) is set in a memory (not shown), a slew rate can be determined using the fixed target voltage, thereby eliminating a need to provide the target voltage controller 22A. The other functional parts are the same as those in FIG. 2.

(Second Modification of Slew Rate Control Device)

Figure 4:
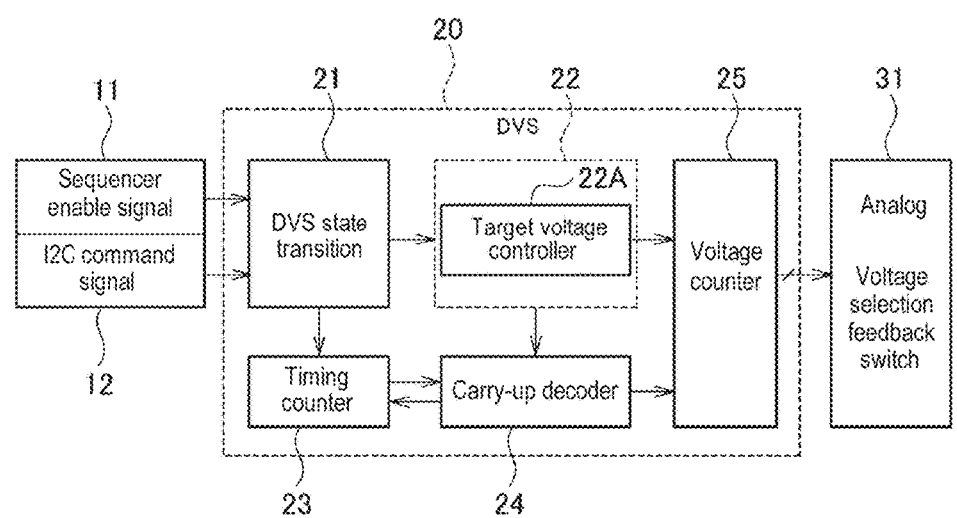
FIG. 4 is a schematic block diagram of a second modification of the slew rate control device shown in FIG. 2.

FIG. 4 shows a second modification of the slew rate control device 20 shown in FIG. 2. As shown in FIG. 4, the voltage controller 22 may not include the initial voltage controller 22B. That is, when a fixed transition starting voltage (for example, 0V) is set in a memory (not shown), a slew rate can be determined using the fixed transition starting voltage, thereby eliminating a need to provide the initial voltage controller 22B. The other functional parts are the same as those in FIG. 2.

(Example of Operation of Slew Rate Control Device)

Figure 5:
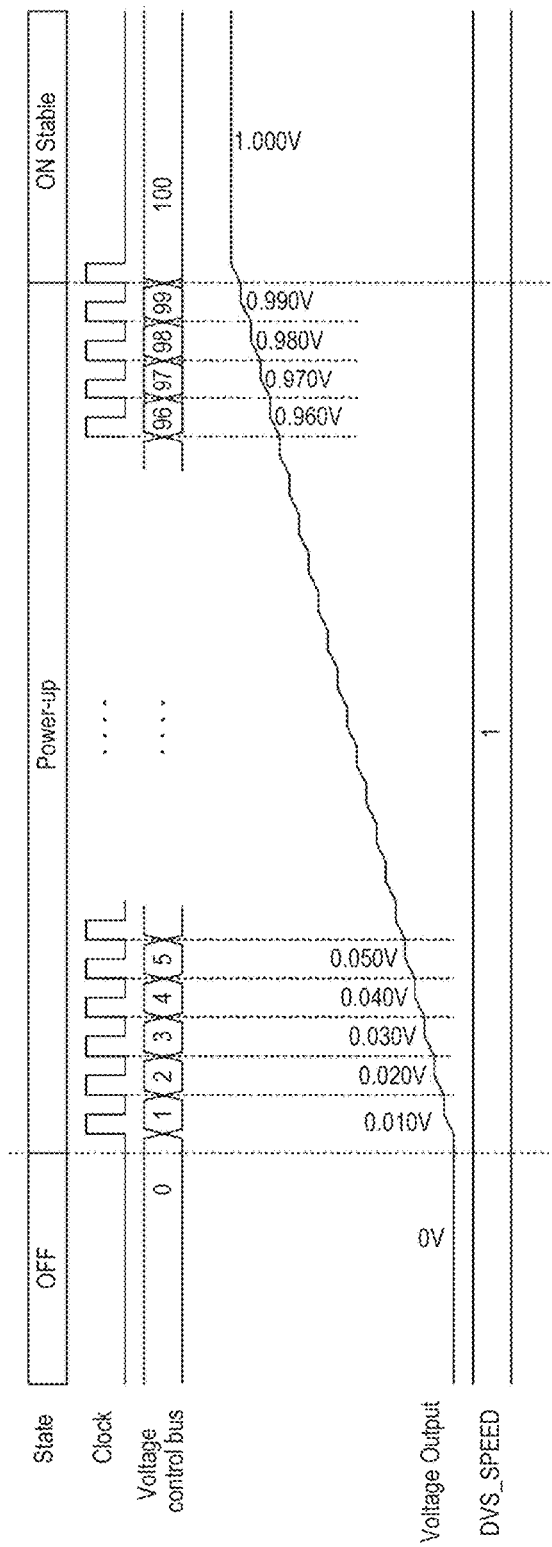
FIG. 5 is a timing chart of a slew rate control device according to a comparative example.

FIG. 5 is a timing chart of a slew rate control device according to a comparative example. Specifically, this timing chart shows transitions of a power supply state signal (State), a clock signal (Clock), a voltage control bus signal (Voltage control bus), an output voltage signal (Voltage Output) and a DVS speed signal (DVS_SPEED). The meaning of each signal will be described later.

As shown in FIG. 5, the slew rate control device according to the comparative example performs general DVS control and raises an output voltage by 10 mV per clock. Therefore, when starting up and shutting down a DC/DC converter to a high speed (for example, 40 mV/μsec or more), there is a problem that a rush current and an overshoot increase.

Figure 6:
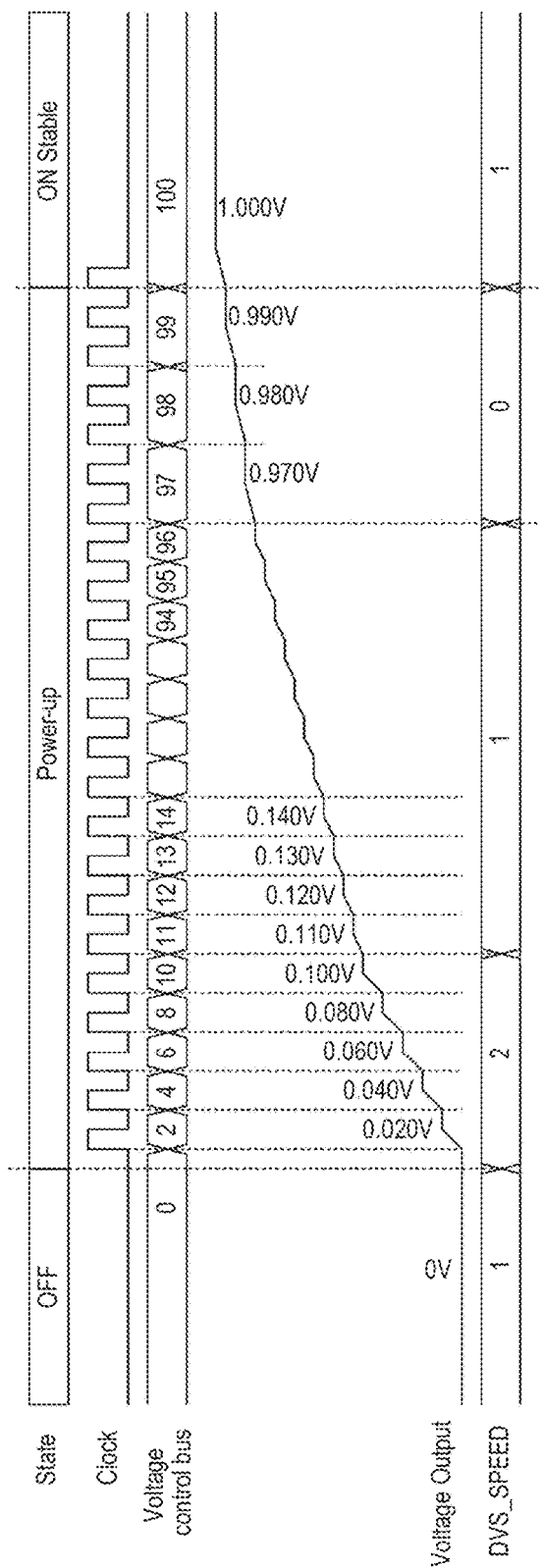
FIG. 6 is a timing chart of the slew rate control device shown in FIG. 2.

FIG. 6 is a timing chart of the slew rate control device 20 shown in FIG. 2. Again, as in FIG. 5, this timing chart shows transitions of a power supply state signal (State), a clock signal (Clock), a voltage control bus signal (Voltage control bus), an output voltage signal (Voltage Output) and a DVS speed signal (DVS_SPEED).

The power supply state signal (State) is a signal indicating a power supply state such as an OFF state, a power-up state, an ON (voltage rise completion) state and the like and is used when the DVS state transition 21 manages a voltage transition, etc. The conditions for transition of the power supply state signal from the OFF state to the power-up state are varied depending on applications including various forms such as an ON command by I2C, an external terminal, an I/F like SPI (Serial Peripheral interface), etc. The transition from the power-up state to the ON state is made when a voltage rises to a target voltage.

The clock signal (Clock) is a clock signal for changing a voltage control bus for controlling an output voltage. Here, a case where a change in voltage occurs at the rise of the clock signal is exemplified, but the present disclosure is not limited to thereto. For example, more clocks may be counted and the voltage may rise by one step.

The voltage control bus signal (Voltage control bus) is a bus signal for determining an output voltage. Here, one step is set with a 10 mV resolution. However, the resolution is not particularly limited but may be larger or smaller than this value.

The output voltage signal (Voltage Output) is an analog output image as seen from an actual analog output terminal.

The DVS speed signal (DVS_SPEED) is a control signal used to change the speed of voltage rise. In this example, a DVS speed signal "0" has a meaning of voltage rise by 10 mV in two clocks, the DVS speed signal "1" has a meaning of voltage rise by 10 mV in one clock, and the DVS speed signal "2" has a meaning of voltage rise by 20 mV in one clock. The meaning of the DVS speed signal varies depending on a specified slew rate in the corresponding circuit. An interval at which the DVS speed signal is changed or a value to which the DVS speed signal is changed may be arbitrarily changed. Another counter is prepared to generate a timing at which the DVS speed is changed and, when a count value of the counter readies a set value, the DVS speed is changed.

(Analog Processing Part)

Next, the analog processing part 31 will be described in detail.

Figure 7:
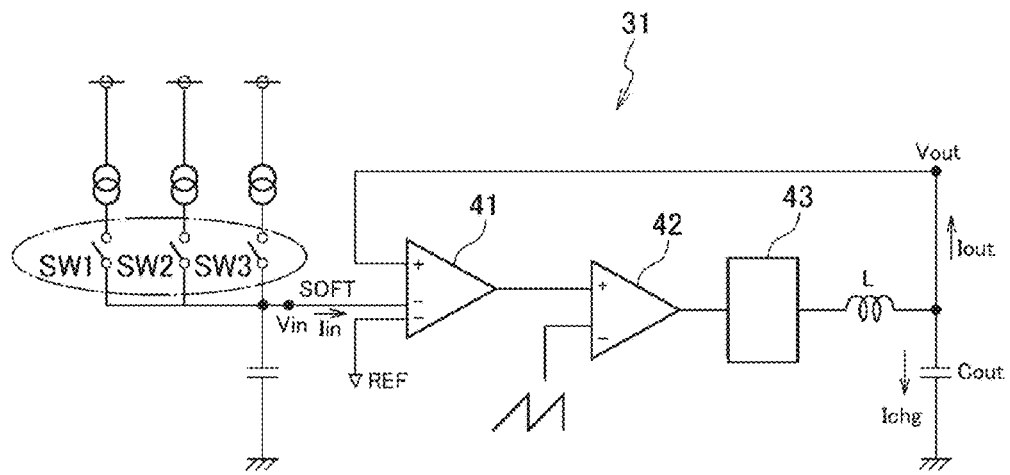
FIG. 7 is a schematic block configuration diagram of an analog processing part included in the slew rate control device shown in FIG. 2.

For example, as shown in FIG. 7, the analog processing part 31 includes voltage selection. feedback switches SW1, SW2 and SW3, a comparator 41, a PWM modulator 42, a driver 43 and a low pass filter (L•Cout). The analog processing part 31 switches the voltage selection feedback switches SW1, SW2 and SW3 with the lapse of time. Thus, the slope of a SOFT voltage can be adjusted so that a rush current and an overshoot can be reduced.

Figure 8:
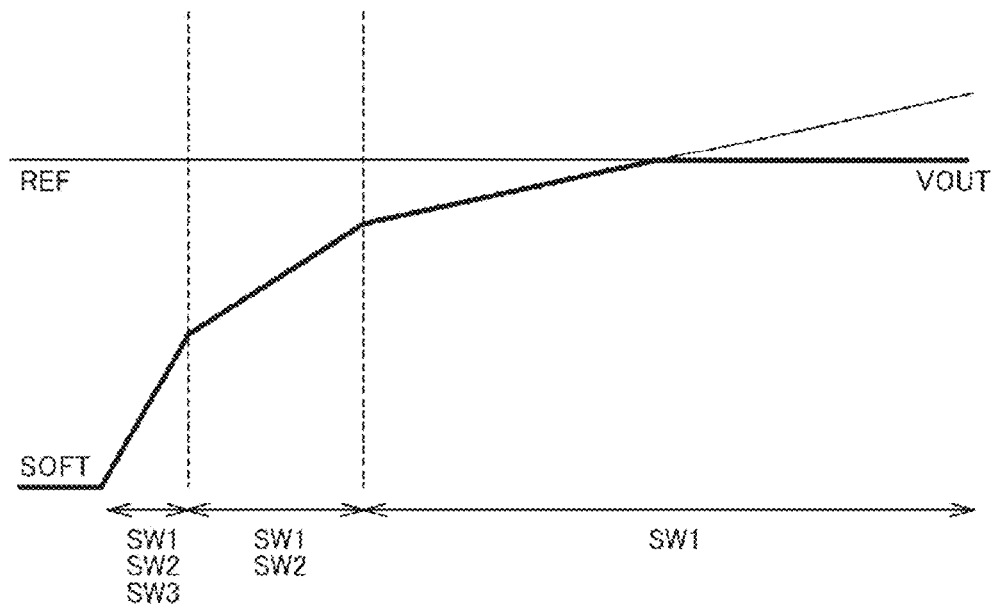
FIG. 8 is a graph showing a slew rate controlled using the analog processing part shown in FIG. 7.

In order to realize this with an analog circuit, for example, three slopes of a slew rate are prepared in advance, and a counter is generated in the analog circuit. By using the counter, a time management is performed, and three voltage selection feedback switches SW1, SW2, and SW3 are switched at an arbitrary timing. For example, as shown in FIG. 8, all of the voltage selection feedback switches SW1 SW2 and SW3 are turned on at the first rise, then two voltage selection feedback switches SW1 and SW2 are turned on, and finally only one voltage selection feedback switch SW1 is turned on. Thus, the slope of the SOFT voltage gradually decreases, so that the rush current and the overshoot can be reduced.

In order to realize this with a digital circuit, similarly, a counter is generated in the digital circuit. By using the counter, a time management is performed, and the voltage selection feedback switches SW, SW2 and SW3 are switched to switch the slew rate. In a case of switching the slew rate from the digital circuit side, the DVS speed signal is used to switch the voltage selection feedback switches SW1, SW2 and SW.

[First Simulation]

Next, a result of a first simulation will be described.

Figure 9A:
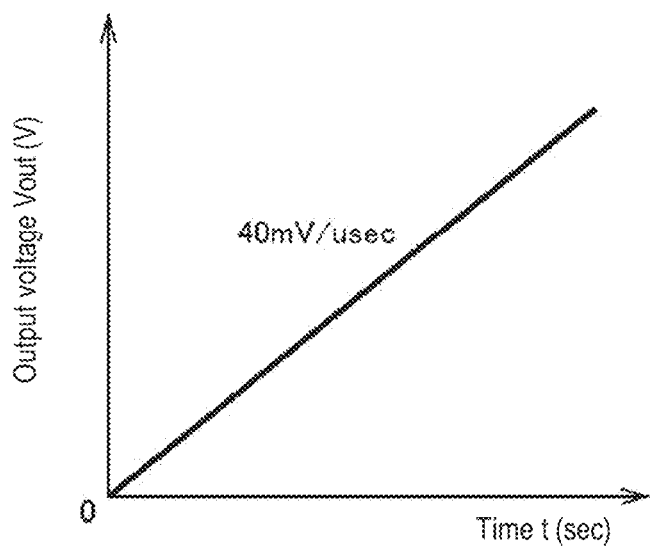
FIGS. 9A to 9C are views showing a result of a first simulation (comparative example), FIG. 9A showing a slew rate and FIGS. 9B and 9C showing screen examples.
Figure 9B:
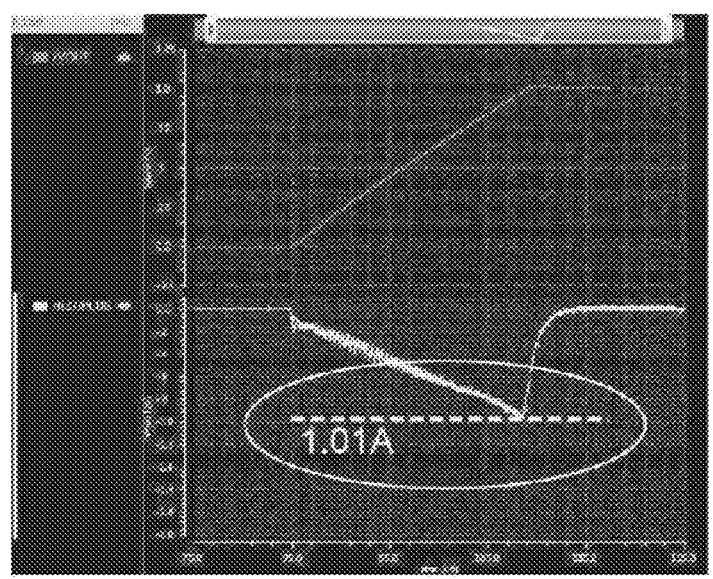
Figure 9C:
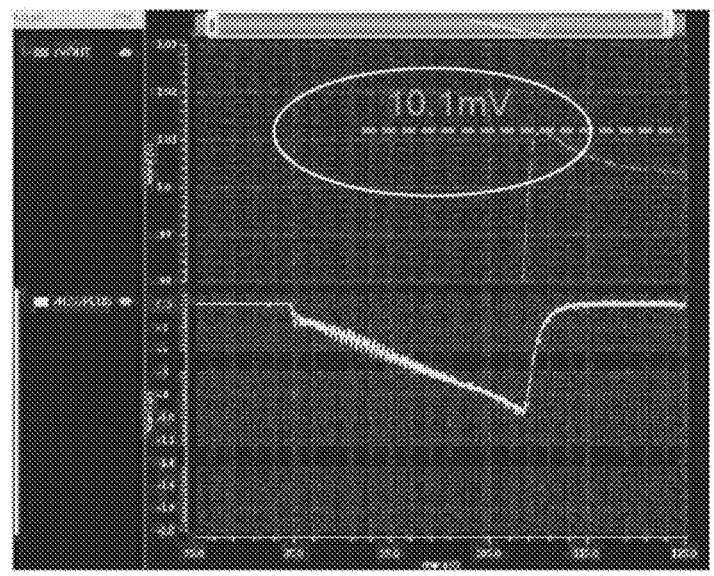

FIGS. 9A to 9C are views showing a result of a first simulation in a case of using the slew rate control device according to the comparative example, FIG. 9A showing a slew rate and FIGS. 9B and 9C showing screen examples. In the comparative example, as shown in FIG. 9A, it is assumed that an output voltage is increased at the same slew rate of 40 mV/μsec.

Figure 10A:
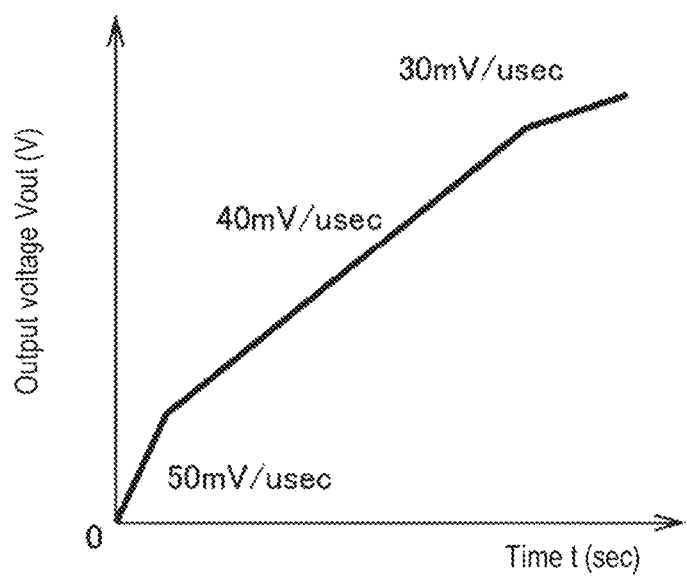
FIGS. 10A to 10C are views showing a result of a first simulation (the embodiment), FIG. 10A showing a slew rate and FIGS. 10B and 10C showing screen examples.
Figure 10B:
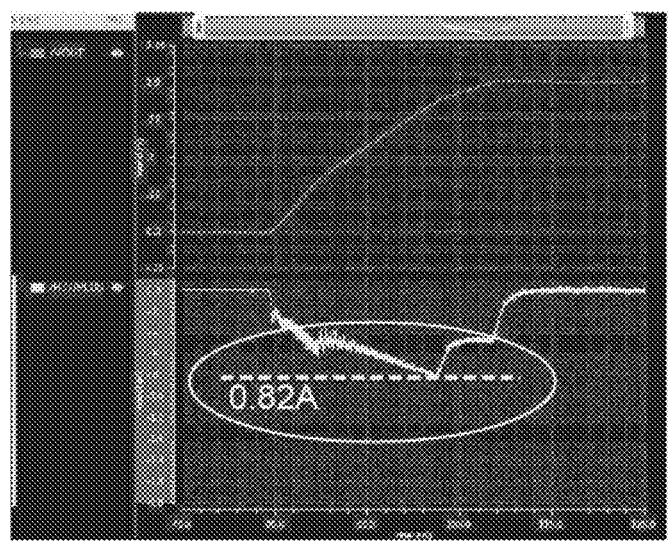
Figure 10C:
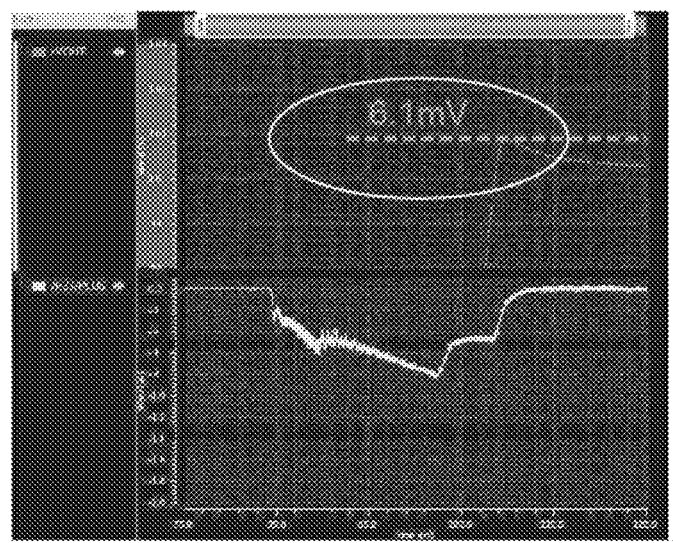

FIGS. 10A to 1.0C are views showing a result of a first simulation in a case of using the slew rate control device 20 according to the embodiment. FIG. 10A showing a slew rate and FIGS. 10B and 10C showing screen examples. In the embodiment, as shown in FIG. 10A, it is assumed that the slew rate is changed in the order of 50 mV/μsec, 40 mV/μsec and 30 mV/μsec.

In this case, as compared with the comparative example, according to the embodiment, a rush current is reduced by 190 mA (=1.01 A−0.82 A) as shown in FIGS. 9B and 10B. Further, as shown in FIGS. 9C and 10C, by laying the slope down, a transient response is alleviated and an overshoot is reduced by 4.0 mV (10.1 mV−6.1 mV).

[Amount of Decrease in Rush Current]

Next, the amount, by which a rush current decreases will be described with reference to FIG. 7.

FIG. 11 shows a relationship between an output voltage $V_{out}$, the slope of the voltage, a charging current $I_{chg}$, an input voltage $V_{in}$ and $I_{in}$ an input current in a case of using the slew rate control device according to the comparative example. The electrostatic capacitance of an output capacitor $C_{out}$ is set to 132 μF. Again, as in FIG. 9A, it is assumed that an output voltage is increased at the same slew rate of 40 mV/μsec.

FIG. 12 shows a relationship between an output voltage $V_{out}$, the slope of the voltage, a charging current $I_{chg}$, an input voltage $V_{in}$ and an input current $I_{in}$ in a case of using the slew rate control device according to the embodiment. The electrostatic capacitance of an output capacitor Cout is set to 132 μF. Again, as in FIG. 10A, it is assumed that the slew rate is changed in the order of 50 mV/μsec, 40 mV/μsec and 30 mV/μsec.

Since the output capacitor $C_{out}$ is charged with the slope of the voltage, when the electrostatic capacitance of the output capacitor $C_{out}$ is denoted by $C_{out}$, the charging current Ichg is expressed by the following equation.

$$I_{chg} = \text{slope} \times C_{out}$$

Further, the input current $I_{in}$ is expressed by the following equation.

$$V_{in} \times I_{in} \times V_{out} \times I_{out}$$

$$I_{in} = (V_{out} \times I_{out}) / V_{in}$$

In this case, since the output current $I_{out}$ is equal to the charging current $I_{chg}$, the input current $I_{in}$ is expressed by the following equation.

$$I_{in} = (V_{out} \times I_{chg}) / V_{in}$$

According to the comparative example, as shown in FIG. 11, as the output voltage $V_{out}$ increases, the input current $I_{in}$ also increases, and when the output voltage $V_{out}$ reaches 1V of the target voltage, the input current $I_{in}$ has a peak value (1.056 A). On the other hand, according to the embodiment, as shown in FIG. 12, before the output voltage $V_{out}$ reaches 1V of the target voltage, the input current has a peak value (0.792 A), and thereafter, the rise of the input current $I_{in}$ is suppressed. Therefore, it is possible to further reduce the rush current, as compared to the comparative example.

The slew rate is changed in the order of 50 mV/μsec, 40 mV/μsec and 30 mV/μsec, but these values are merely an example. That is, these values are uniquely determined in order to calculate the amount by which the rush current decreases when the slew rate is changed.

[Second Simulation]

Next, a result of a second simulation will be described. Hereinafter, differences from the first simulation will be mainly described and detailed description of similar points will be omitted.

In the comparative example, as in the first simulation, it is assumed that an output voltage is increased at the same slew rate of 40 mV/μsec. On the other hand, in the embodiment, it is assumed that the slew rate is changed in the order of 80 mV/μsec, 40 mV/μsec and 0 mV/μsec. A rush current and an overshoot are reduced by changing the slope of the slew rate when VID is changed (VGG VSYS=3.6V, VID=40 mV/μsec, and Ta=25 degrees C.).

Figure 13A:
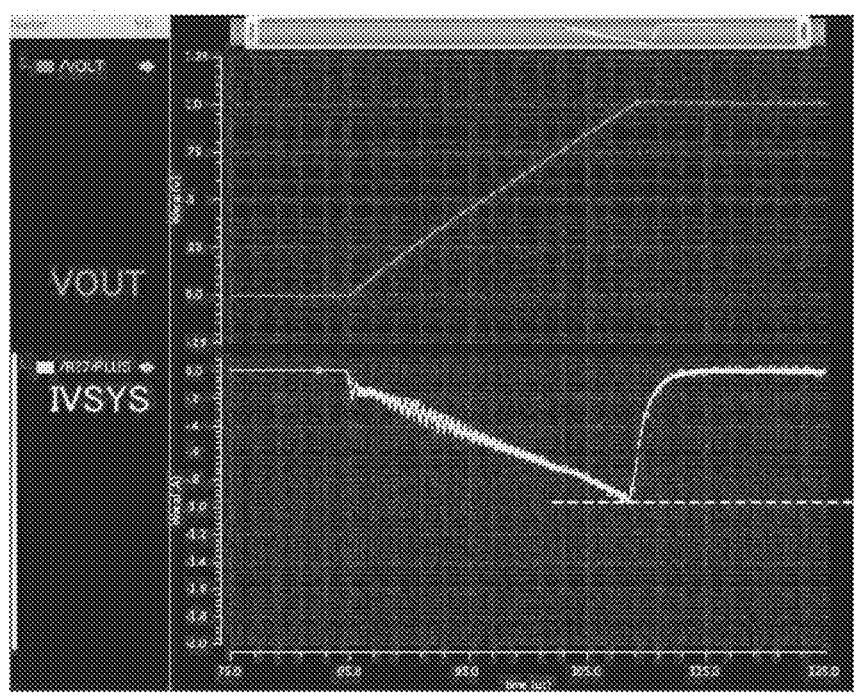
FIGS. 13A and 13B are views showing screen examples showing a result of a second simulation for the comparative example and the embodiment, respectively.
Figure 13B:
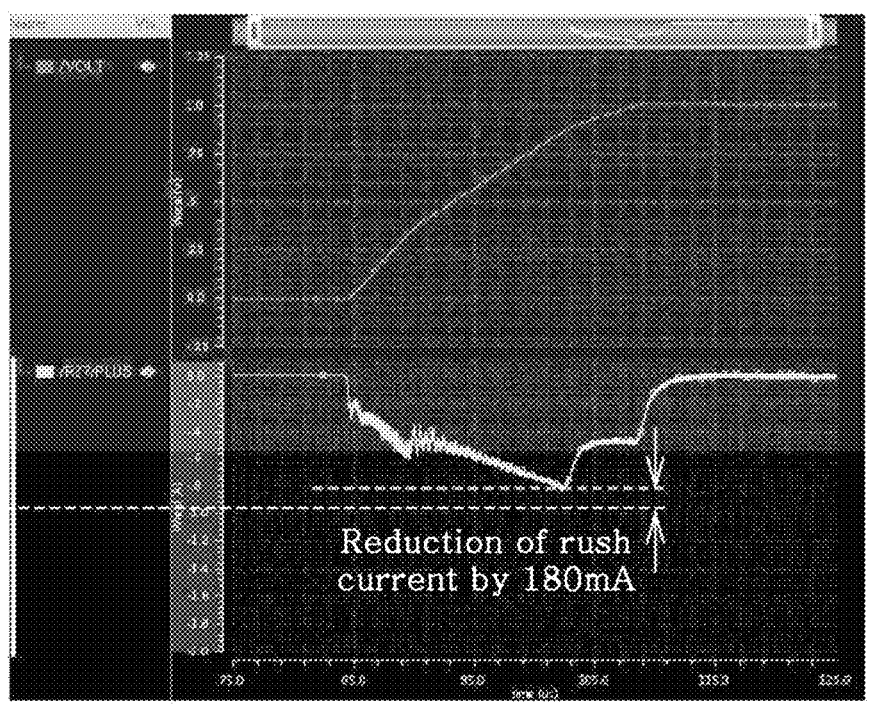

FIGS. 13A and 13B are screen examples showing the result of the second simulation for the comparative example and the embodiment, respectively. In these figures, "IVSYS" means power supplied from a power supply. As shown in FIGS. 13A and 13B, according to the embodiment, the rush current is reduced by 180 mA in comparison with the comparative example.

Figure 14A:
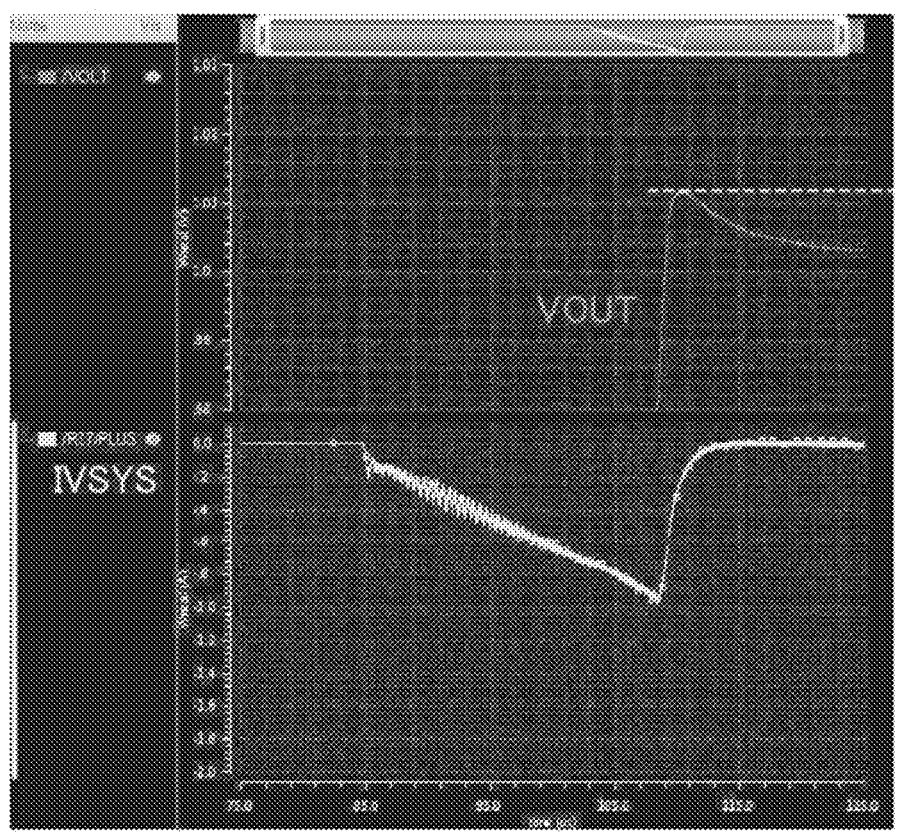
FIGS. 14A and 14B are views showing screen examples showing a result of the second simulation for the comparative example and the embodiment, respectively.
Figure 14B:
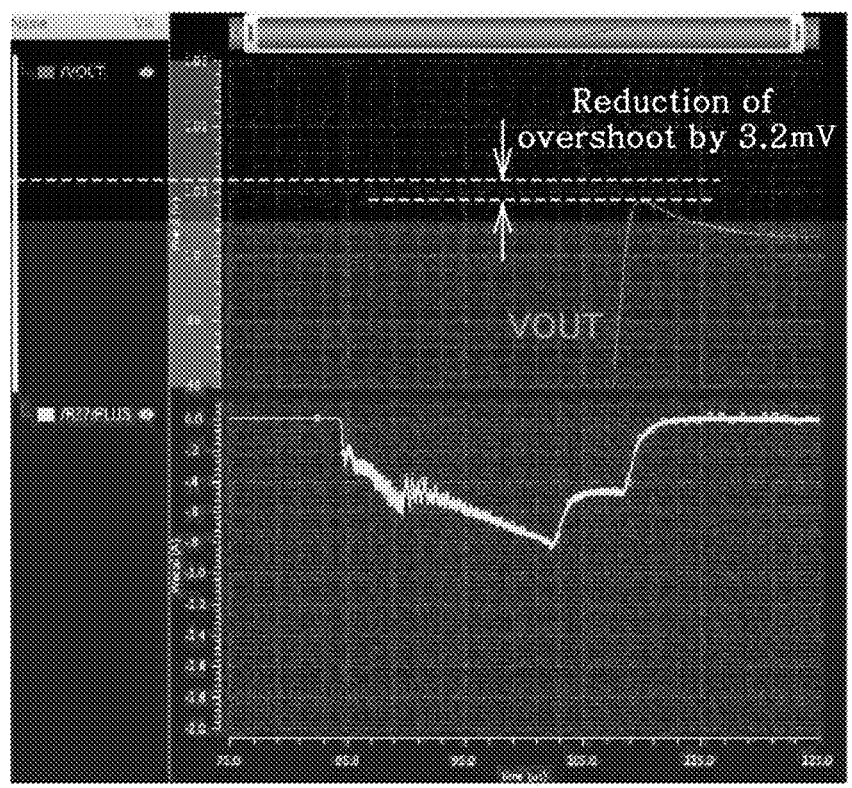

FIGS. 14A and 14B are screen examples showing the result of the second simulation for the comparative example and the embodiment, respectively As shown in FIGS. 14A and 14B, according to the embodiment, the overshoot is reduced by 3.2 mV comparison with the comparative example.

[Result of Evaluation on Trial Products]

Next, a result of evaluation on a trial product will be described. Hereinafter, differences from the second simulation will be mainly described, and detailed description of similar points will be omitted.

Figure 15B:
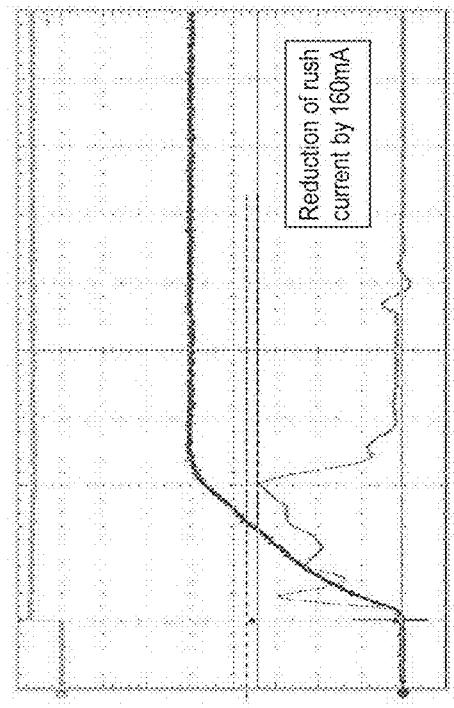
FIGS. 15A and 15B are views showing screen examples showing a result of evaluation on a trial product for the comparative example and the embodiment, respectively.
Figure 15A:
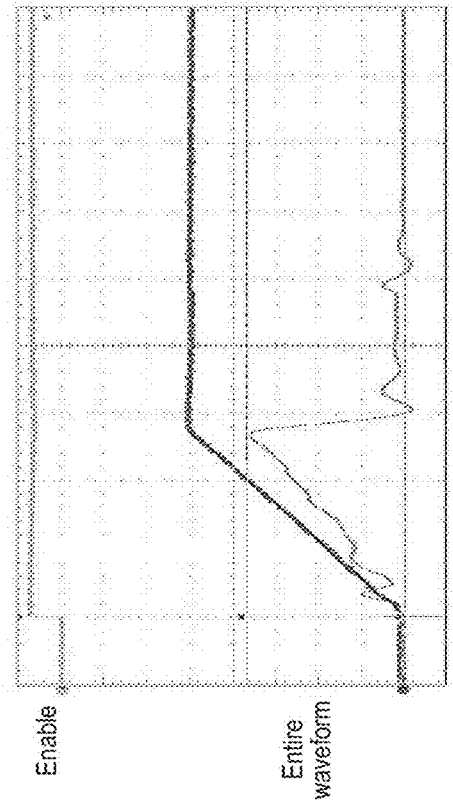

FIGS. 15A and 15B are screen examples showing a result of evaluation on a trial product for the comparative example and the embodiment, respectively. As shown in FIGS. 15A and 15B according to the embodiment, the rush current is reduced by 160 mA in comparison with the comparative example.

Figure 16A:
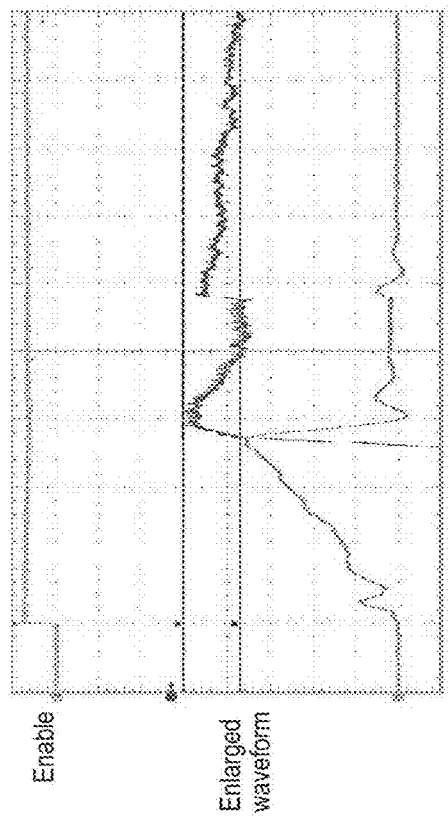
FIGS. 16A and 16B are views showing screen examples showing a result of evaluation on a trial product for the comparative example and the embodiment, respectively.
Figure 16B:
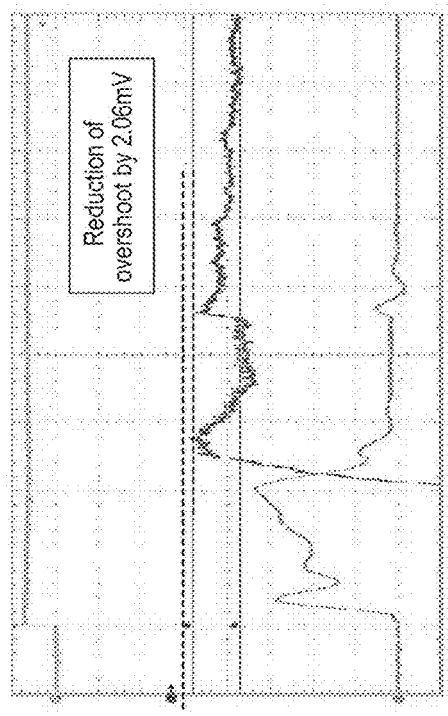

FIGS. 16A and 16B are screen examples showing a result of evaluation on a trial product for the comparative example and the embodiment, respectively. As shown in FIGS. 16A and 16B, according to the embodiment, the overshoot is reduced by 2.06 mV in comparison with the comparative example.

The present inventors have conducted experiments while varying conditions for changing the slew rate and found that it is important to change the slew rate in a direction in which the slew rate decreases over time. For example, when the slew rate became large after becoming small, the effect on the rush current is poor.

In addition, although the case of dividing the difference between the target voltage and the present voltage into three regions has been exemplified in the above, it has been found that it is advantageous to divide it into more regions. When the slew rate is controlled so as to draw an arc from the transition starting voltage to the target voltage, more effect on the rush current is obtained.

As described above, according to the present embodiment, it is possible to provide a slew rate control device and a slew rate control method capable of reducing a rush current and an overshoot.

[Other Embodiments]

As described above,the present disclosure has been illustrated by way of some embodiments, but the description and drawings which constitute a part of this disclosure are exemplary and should not be construed to limit the present disclosure. Various alternative embodiments, examples and operation techniques will be apparent to those skilled in the art from this disclosure.

The slew rate control device according to the present embodiment can be applied to a DC/DC converter or the like which needs to reduce a rush current and an overshoot.

According to the present embodiment, it is possible to provide a slew rate control device and a slew rate control method capable of reducing a rush current and an overshoot.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A slew rate control device for controlling a slew rate of an output voltage of a power supply, comprising:
    a setting part configured to set a transition starting voltage and a target voltage of the output voltage, the transition starting voltage or the target voltage used to determine the slew rate; and
    a control part configured to control the slew rate, based on the transition starting voltage or the target voltage set by the setting part, so that the slew rate becomes slower as the output voltage of the power supply approaches from the transition starting voltage to the target voltage,
    wherein the transition starting voltage and the target voltage are held until a transition of the output voltage ends.

2. The slew rate control device of claim 1, wherein the control part controls the slew rate so that the slew rate becomes faster in a region close to the transition starting voltage and becomes slower in a region close to the target voltage so as to draw an arc.

3. The slew rate control device of claim 2, wherein the control part includes a DVS state transition which manages DVS voltage transition.

4. The slew rate control device of claim 3, wherein the control part includes a timing counter used to determine the slew rate.

5. The slew rate control device of claim 4, wherein the control part includes a carry-up decoder which is configured to divide a difference between the target voltage and the transition starting voltage into at least three regions and adjusts a timing at which a voltage is changed.

6. The slew rate control device of claim 5, wherein the control part includes a voltage counter which is configured to change a voltage at a timing adjusted by the carry-up decoder and outputs a decode value to an analog processing part.

7. The slew rate control device of claim 6, wherein the analog processing part includes voltage selection feedback switches, and switches the voltage selection feedback switches with the lapse of time.

8. The slew rate control device of claim 1, wherein the setting part includes a target voltage controller which sets the target voltage to an arbitrary target voltage.

9. The slew rate control device of claim 1, wherein the setting part includes an initial voltage controller which sets the transition starting voltage to an arbitrary transition starting voltage.

10. The slew rate control device of claim 1, wherein the power supply includes a DC/DC converter, and an output slew rate of the DC/DC converter is controlled.

11. A method for controlling a slew rate of an output voltage of a power supply, comprising:
    setting a transition starting voltage and a target voltage of the output voltage, the transition starting voltage or the target voltage used to determine the slew rate; and
    controlling the slew rate, based on the transition starting voltage or the target voltage, so that the slew rate becomes slower as the output voltage of the power supply approaches from the transition starting voltage to the target voltage,
    wherein the transition starting voltage and the target voltage are held until a transition of the output voltage ends.

12. The method of claim 11, wherein the act of controlling includes controlling the slew rate so that the slew rate becomes faster in a region close to the transition starting voltage and becomes slower in a region close to the target voltage so as to draw an arc.

13. The method of claim 12, wherein the act of controlling includes using a DVS state transition to manage DVS voltage transition.

14. The method of claim 13, wherein the act of controlling includes using a timing counter to determine the slew rate.

15. The method of claim 14, wherein the act of controlling includes using a carry-up decoder to divide a difference between the target voltage and the transition starting voltage into at least three regions and adjust a timing at which a voltage is changed.

16. The method of claim 15, wherein the act of controlling includes using a voltage counter to change a voltage at a timing adjusted by the carry-up decoder and output a decode value to an analog processing part.

17. The method of claim 16, wherein the analog processing part includes voltage selection feedback switches, and switches the voltage selection feedback switches with the lapse of time.

18. The method of claim 11, wherein the act of setting includes using a target voltage controller to set the target voltage to an arbitrary target voltage.

19. The method of claim 11, wherein the act of setting includes using an initial voltage controller to set the transition starting voltage to an arbitrary transition starting voltage.

20. The method of claim 11, wherein the power supply includes a DC/DC converter, and an output slew rate of the DC/DC converter is controlled.

\* \* \* \* \*